US009418967B2

(12) United States Patent
Koshiishi et al.

(10) Patent No.: US 9,418,967 B2
(45) Date of Patent: Aug. 16, 2016

(54) SEMICONDUCTOR DEVICE (71) Applicant: PS4 Luxco S.a.r.l., Luxembourg (LU)

(72) Inventors: Kazutaka Koshiishi, Tokyo (JP);
Mitsuaki Katagiri, Tokyo (JP); Satoshi Isa, Tokyo (JP); Dai Sasaki, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/436,028

(22) PCT Filed: Sep. 27, 2013

(86) PCT No.: PCT/JP2013/076314
§ 371 (c)(1),
(2) Date: Apr. 15, 2015

(87) PCT Pub. No.: WO2014/061426
PCT Pub. Date: Apr. 24, 2014

(65) Prior Publication Data
US 2015/0262974 A1    Sep. 17, 2015

(30) Foreign Application Priority Data
Oct. 15, 2012    (JP) ................................. 2012-227844

(51) Int. Cl.
*H01L 25/065*    (2006.01)
*H01L 25/18*    (2006.01)
(Continued)

(52) U.S. Cl.
CPC .......... *H01L 25/0657* (2013.01); *H01L 21/563* (2013.01); *H01L 23/3128* (2013.01); *H01L 23/32* (2013.01); *H01L 23/50* (2013.01);
(Continued)

(58) Field of Classification Search
CPC ... H01L 25/0657; H01L 23/32; H01L 21/563; H01L 23/50; H01L 23/3128; H01L 25/18; H01L 2225/06555; H01L 23/5286; H01L 23/5226; H01L 23/481; H01L 2225/06517; H01L 2924/15311; H01L 2224/16145; H01L 2225/06541; H01L 2224/73204; H01L 2224/32145; H01L 2225/06513
See application file for complete search history.

(56) References Cited

U.S. PATENT DOCUMENTS

2006/0195734 A1    8/2006    Shibata et al.
2006/0235577 A1    10/2006    Ikeda et al.
(Continued)

FOREIGN PATENT DOCUMENTS

JP    2007134426    5/2007

OTHER PUBLICATIONS

Application No. PCT/JP2013/076314, International Search Report, Nov. 12, 2013.

*Primary Examiner* — David Vu
(74) *Attorney, Agent, or Firm* — Kunzler Law Group, PC (57) ABSTRACT

A semiconductor device includes a package substrate, an IF chip, and a core chip. The package substrate has: first electrodes aligned and disposed on a first rear surface; second electrodes aligned and disposed in the first direction (Y direction) on a first front surface; and wiring that electrically connects the first electrodes and the second electrodes. The IF chip has third electrodes bonded to the second electrodes. The core chip is connected to the IF chip. In the first direction, the length of the IF chip is more than that of the core chip but equal to or less than that of the package substrate. One of the first electrodes is disposed further toward the outside than a core chip end portion in the first direction. At least one of the second electrodes is disposed further toward the outside than the core chip end portion in the first direction.

6 Claims, 9 Drawing Sheets

(51) Int. Cl.
    *H01L 23/31*     (2006.01)
    *H01L 23/50*     (2006.01)
    *H01L 21/56*     (2006.01)
    *H01L 23/32*     (2006.01)
    *H01L 25/07*     (2006.01)
    *H01L 23/48*     (2006.01)
    *H01L 23/522*     (2006.01)
    *H01L 23/528*     (2006.01)

(52) U.S. Cl.
    CPC .............. *H01L25/065* (2013.01); *H01L 25/07* (2013.01); *H01L 25/18* (2013.01); *H01L 23/481* (2013.01); *H01L 23/5226* (2013.01); *H01L 23/5286* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2225/06513* (2013.01); *H01L 2225/06517* (2013.01); *H01L 2225/06541* (2013.01); *H01L 2225/06555* (2013.01); *H01L 2225/06596* (2013.01); *H01L 2924/15311* (2013.01)

(56) References Cited

U.S. PATENT DOCUMENTS

| | | | |
|---|---|---|---|
| 2011/0147945 A1 | 6/2011 | Yoshida et al. | |
| 2011/0175639 A1* | 7/2011 | Yoko | G06F 1/12 324/762.06 |
| 2012/0187401 A1 | 7/2012 | Waki et al. | |

* cited by examiner

SEMICONDUCTOR DEVICE

TECHNICAL FIELD

The present invention relates to a semiconductor device provided with a chip stack in which a plurality of semiconductor chips are stacked on one another.

BACKGROUND ART

In recent years, as electronic equipment has become more compact and its level of functionality has increased, chip-on-chip (CoC) type semiconductor devices have been developed, these being provided with a chip stack in which a plurality of semiconductor chips are stacked on one another (see Japanese Patent Kokai 2010-161102 (referred to hereinafter as patent literature article 1)). Each of the semiconductor chips forming the chip stack has through-electrodes which penetrate through a semiconductor substrate. The semiconductor chips are electrically connected to each other by way of the through-electrodes.

In the semiconductor device described in patent literature article 1, one of the semiconductor chips forming the chip stack is a logic chip (an interface chip), and the other semiconductor chips are memory chips. The memory chips have a circuit-forming surface on which memory circuits are formed, and through-electrodes which penetrate through the memory chip. The interface (IF) chip has a circuit-forming surface on which IF circuits are formed, and through-electrodes which penetrate through the IF chip. The logic chip is mounted on a package substrate, and the memory chips are provided on the logic chip.

A plurality of metal balls, forming external terminals, are provided on the package substrate. The arrangement of the metal balls, and the pitch between the metal balls, is generally determined in accordance with standardized specifications. Electrode pads are provided on the surface of the package substrate on the opposite side to the surface on which the external terminals are formed. The electrode pads are electrically connected to electrode pads formed on the IF chip.

The circuit pattern on an IF chip is generally simpler than the circuit pattern on a memory chip, and therefore the surface area of the circuits on the IF chip can be reduced compared with the surface area of the circuits on the memory chip. IF chips are therefore generally smaller than memory chips.

Figure 1:
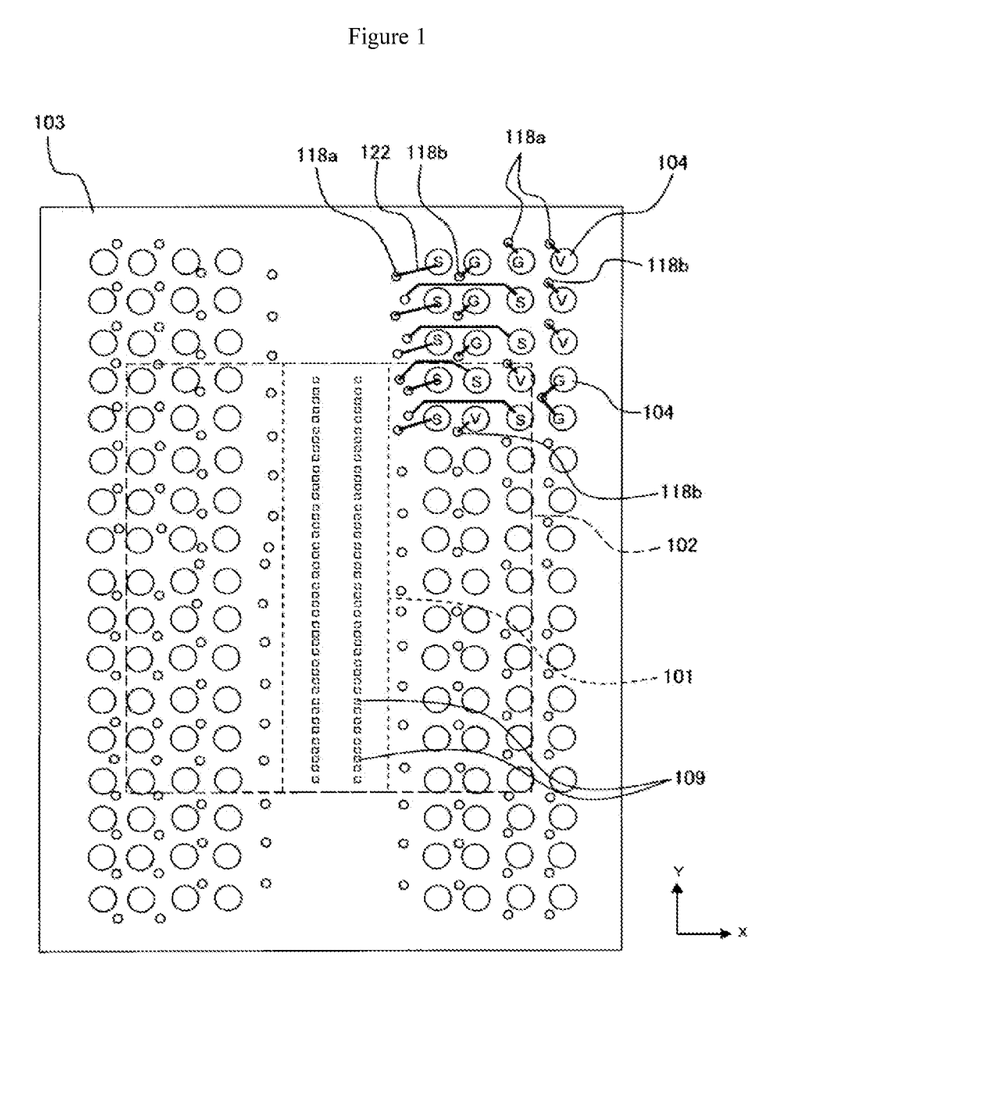
FIG. 1 is a drawing illustrating the wiring line layout on the reverse surface side of a package substrate in a semiconductor device according to the related art.
Figure 2:
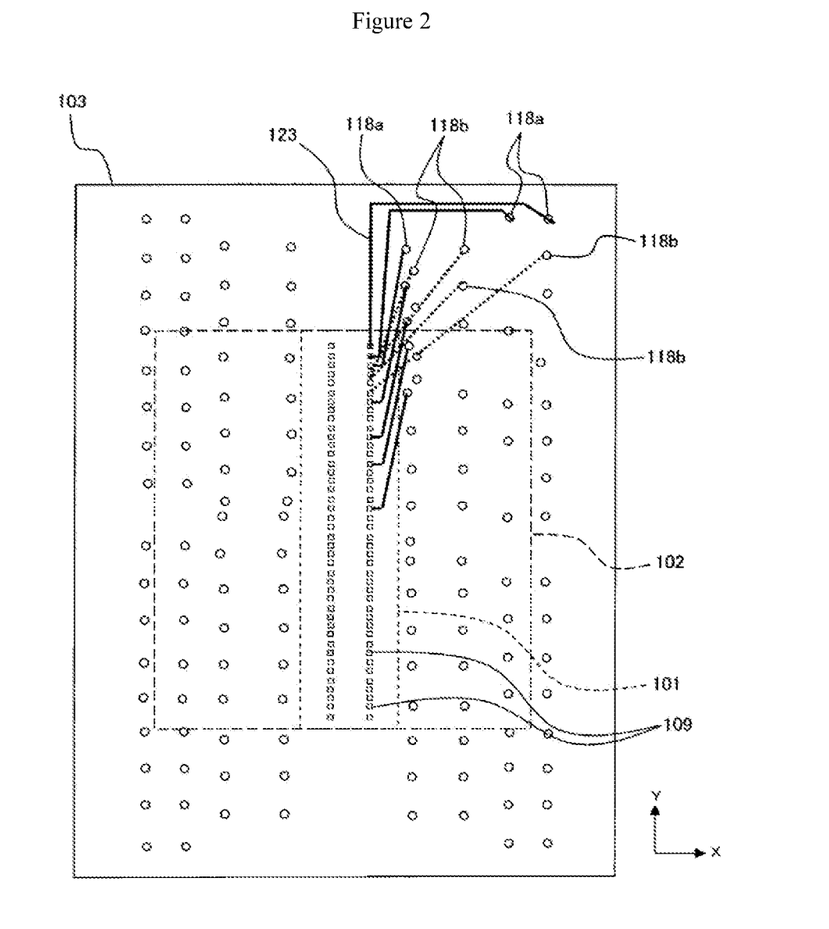
FIG. 2 is a drawing illustrating the wiring line layout on the obverse surface side of the package substrate in the semiconductor device according to the related art.

FIG. 1 and FIG. 2 were prepared by the applicant of this application in order to describe one of the problems to be resolved by the invention, and they illustrate an example of the wiring line patterns on the obverse surface and the reverse surface of a package substrate.

FIG. 1 illustrates a wiring line pattern 122 formed on a surface (referred to hereinafter as the reverse surface) of a package substrate 103 on which external terminals 104 are formed. It should be noted that in FIG. 1, for convenience, lines are also included to indicate the external form of an IF chip 101, a core chip 102 and electrode pads 109 formed on the surface (referred to hereinafter as the obverse surface) of the package substrate 103 on the side opposite to the reverse surface thereof. Vias 118a and 118b penetrating through the package substrate 103 are provided in the vicinity of each external terminal 104.

FIG. 2 illustrates a wiring line pattern 123 formed on the obverse surface of the package substrate 103. It should be noted that in FIG. 2, for convenience, lines are also included to indicate the external form of the IF chip 101 and the core chip 102. The vias 118a and 118b, which are electrically connected to the external terminals 104, are connected by way of the wiring lines 123 to the electrode pads 109 formed on the obverse surface of the package substrate 103.

The positions of the external terminals 104 on the package substrate 103 are defined by a standard. The IF chip 101 is smaller than the core chip 102. The electrode pads 109 connect to the electrode pads on the IF chip 101, and are thus arranged in the vicinity of the center of the package substrate 103. The plurality of electrode pads 109 on the package substrate 103 are aligned in one direction in the region in which the IF chip 101 is present. As a result, if the length of the IF chip 101 in the pad row direction (the Y-direction in the drawing) is short, then the density of the wiring lines 123 formed on the obverse surface of the package substrate 103, in other words wiring lines which electrically connect the external terminals 104 to the IF chip 101, is high.

In particular, as illustrated in FIG. 2, the plurality of wiring lines 123 routed from the vias 118a that are electrically connected to the external terminals 104 provided toward the outside of the package substrate 103 become congested. In some cases there may even be vias 118b from which it is difficult to connect a wiring line to a pad 109 formed on the obverse surface of the package substrate 103.

A semiconductor device provided with a package substrate with which wiring lines can be routed easily is therefore desirable.

PATENT LITERATURE

Patent literature article 1: Japanese Patent Kokai 2010-161102

SUMMARY OF THE INVENTION

A semiconductor device in one mode of embodiment is provided with a package substrate, an interface chip and a core chip. The package substrate has a plurality of first electrodes arranged on a first reverse surface, a plurality of second electrodes arranged along a first direction on a first obverse surface on the opposite side to the first reverse surface, and wiring lines which electrically connect the first electrodes and the second electrodes. The interface chip is provided on the first obverse surface of the package substrate. The interface chip has a plurality of third electrodes which are arranged on a second reverse surface which faces the package substrate, and which are joined to the plurality of second electrodes. The core chip is provided on a second obverse surface on the opposite side to the second reverse surface of the interface chip, and is electrically connected to the interface chip. The length of the interface chip in the first direction is greater than the length of the core chip in the first direction, and is at most equal to the length of the package substrate in the first direction. At least one of the plurality of first electrodes is disposed to the outside of the end portion of the core chip in the first direction. At least one of the plurality of second electrodes is disposed to the outside of the end portion of the core chip in the first direction.

According to the abovementioned configuration, wiring lines connecting the first electrodes and the second electrodes formed on the package substrate can be formed extending substantially in a second direction which is orthogonal to the first direction. As a result, the wiring lines on the package substrate can be routed easily, without said wiring lines being densely packed.

The aims, characteristics and advantages of the present invention, including those mentioned above, will become clear through the following description which refers to the accompanying drawings in which the present invention is illustrated by way of example

MODES OF EMBODYING THE INVENTION

Modes of embodying the present invention will now be described with reference to the drawings. In the following modes of embodiment, a DRAM is mentioned as one example of a semiconductor device. The semiconductor device of the present invention is not limited to being a DRAM, and may also be another semiconductor device such as an SRAM, a PRAM or a flash memory.

Figure 3:
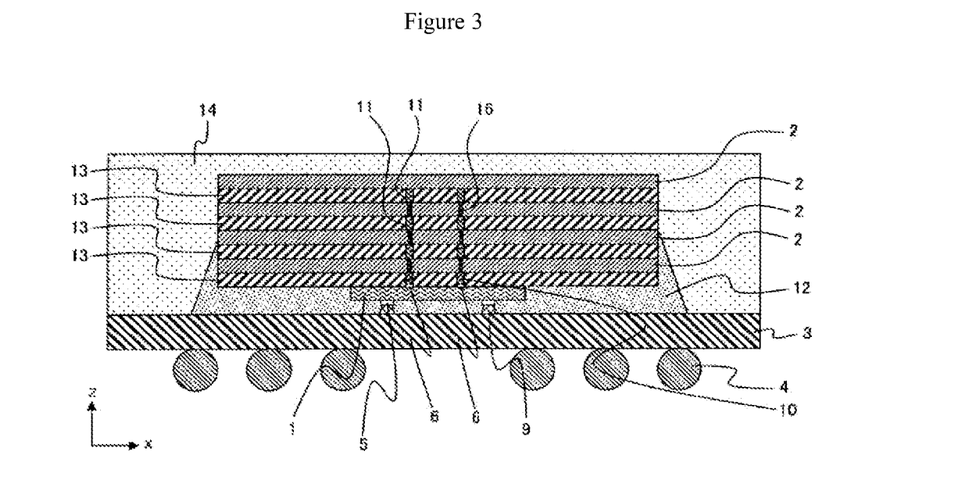
FIG. 3 is a cross-sectional view of a semiconductor device in a first mode of embodiment.
Figure 4:
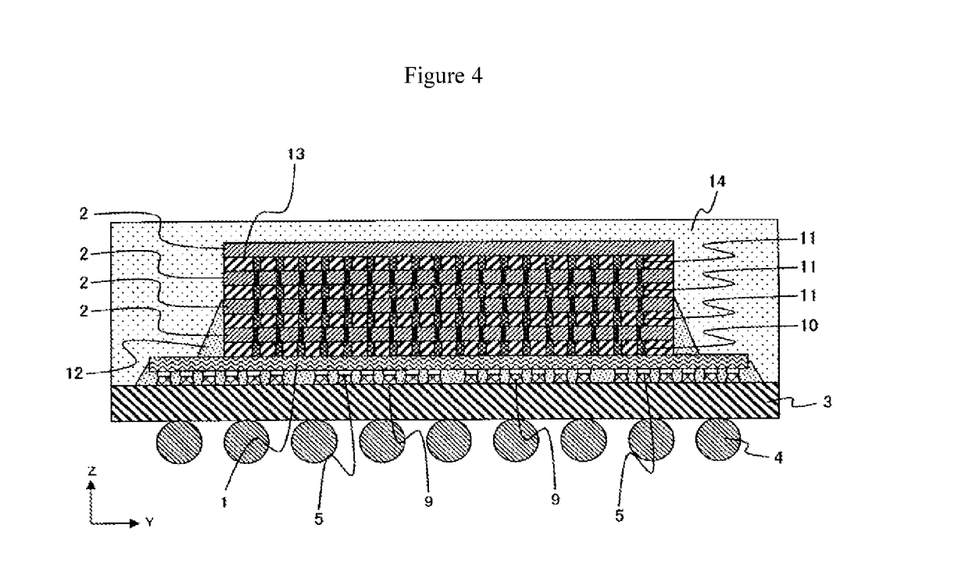
FIG. 4 is another cross-sectional view of the semiconductor device in the first mode of embodiment.
Figure 5:
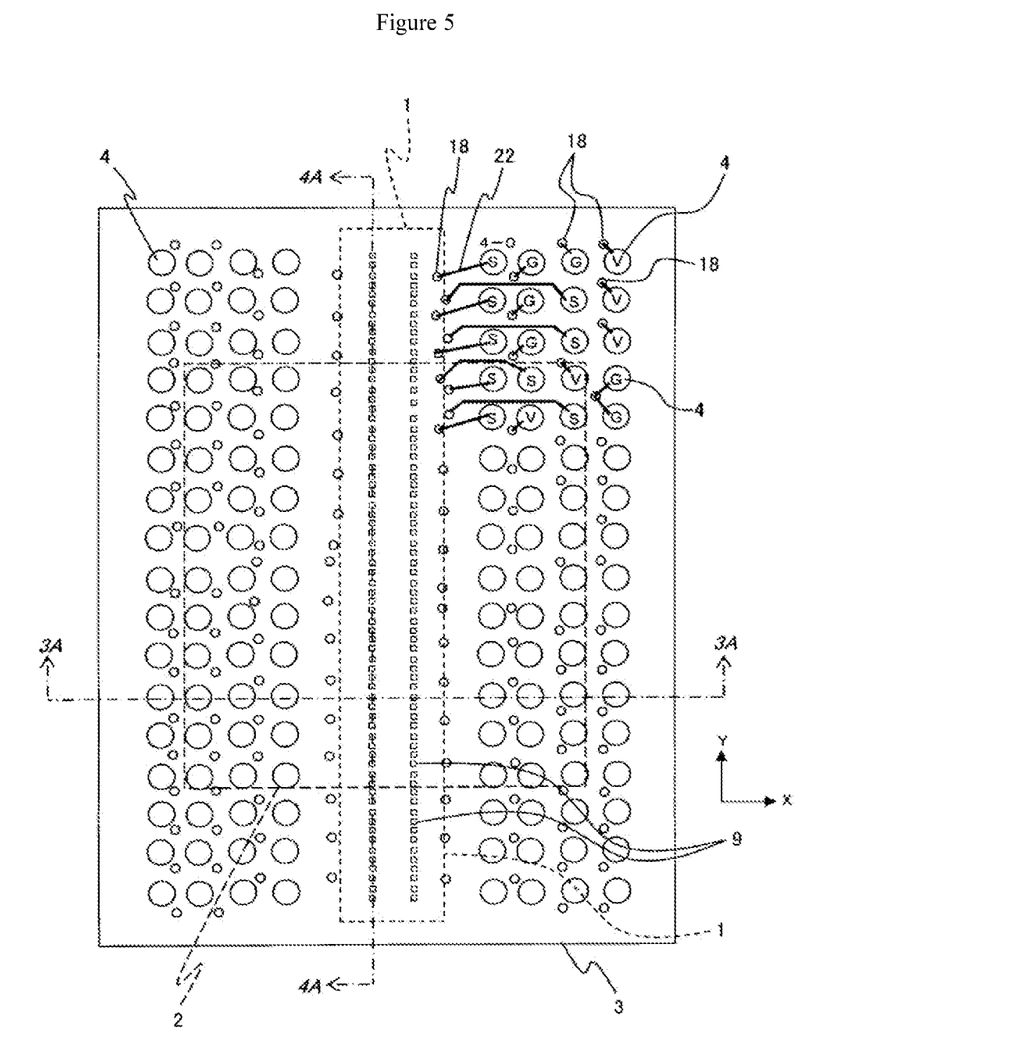
FIG. 5 is a drawing illustrating the wiring line layout on the reverse surface of the package substrate.
Figure 6:
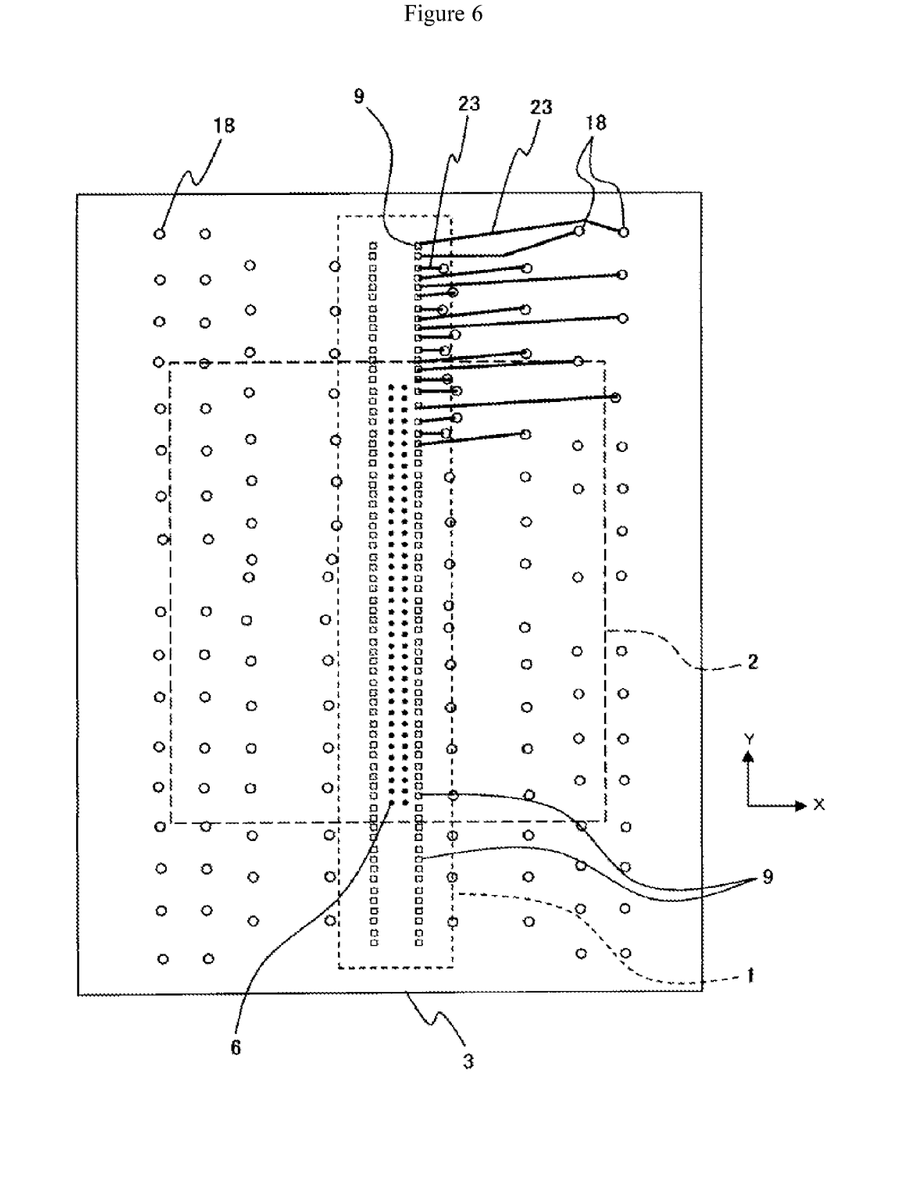
FIG. 6 is a drawing illustrating the wiring line layout on the obverse surface of the package substrate.

FIG. 3 and FIG. 4 are cross-sectional views of a semiconductor device in a first mode of embodiment. FIG. 5 is a drawing illustrating the wiring line layout on the reverse surface of a package substrate in the semiconductor device. FIG. 6 illustrates the wiring line layout on the obverse surface of the package substrate in the semiconductor device, in other words on a face on the opposite side to the face illustrated in FIG. 5. Here, the cross-section illustrated in FIG. 3 is a cross-section along the line 3A-3A in FIG. 5, and the cross-section illustrated in FIG. 4 is a cross-section along the line 4A-4A in FIG. 5.

The semiconductor device is a CoC-type semiconductor device provided with a chip stack in which a plurality of semiconductor chips 1, 2 are stacked on one another. The semiconductor device comprises a package substrate 3 and a chip stack 1, 2 provided on the package substrate 3.

A non-conductive paste (NCP) 12 is provided between the package substrate 3 and the chip stack 1, 2. Gaps between the semiconductor chips 1 and 2 forming the chip stack may be filled with an underfill material 13. A sealing resin 14 is preferably provided around the chip stack, on the package substrate 3.

In the example illustrated in FIG. 3 and FIG. 4, the semiconductor chip in the lowermost layer of the chip stack, in other words the semiconductor chip connected to the package substrate 3, is an IF chip (logic chip) 1. The IF chip 1 is provided on the obverse surface of the package substrate 3. A core chip (memory chip) 2 is provided on the IF chip 1. There may be one core chip 2, or a plurality of core chips 2 may be stacked on one another.

A plurality of first electrodes 4 are provided on the reverse surface of the package substrate 3. The first electrodes 4 should be the external terminals of the semiconductor device. The external terminals 4 should be metal balls such as solder balls. A plurality of electrodes (pads) 9 are provided on the obverse surface of the package substrate 3. Each electrode 9 is electrically connected to a corresponding external terminal 4 by way of wiring lines 22 and 23 formed on the package substrate 3.

A plurality of electrodes (pads) 5 are provided on the reverse surface of the IF chip 1, in other words on the surface which faces the package substrate 3. Each electrode 5 formed on the reverse surface of the IF chip 1 is joined to a corresponding electrode 9 formed on the obverse surface of the package substrate 3. Therefore the electrodes 9 on the package substrate 3 and the electrodes 5 on the IF chip 1 are disposed in positions that essentially coincide as seen in the Z-direction in the drawing.

A plurality of electrodes (pads) 6 are provided on the obverse surface of the IF chip 1, in other words on the surface which faces the core chip 2. The plurality of electrodes (pads) 6 formed on the obverse surface of the IF chip 1 are electrically connected, by way of wiring lines formed on the IF chip 1, to the electrodes 5 formed on the reverse surface of the IF chip 1.

The IF chip 1 and the core chip 2 are electrically connected by way of bump electrodes 10. Core chips 2 adjacent to one another are electrically connected to one another by way of bump electrodes 11. Through electrodes 16 which electrically connect the bump electrodes 11 formed on the obverse surface of the core chip 2 to the bump electrodes 10 or 11 formed on the reverse surface of the core chip 2 are provided in the core chip 2. However, it is not necessary to provide through electrodes 16 in the core chip 2 in the uppermost layer of the chip stack.

FIG. 5 illustrates the wiring line layout on the reverse surface side of the package substrate 3. In order for the positions of the wiring lines and the electrodes to be readily understandable, lines indicating the external form of the IF chip 1 and the core chip 2 are also illustrated in FIG. 5. It should be noted that in FIG. 5, 'V' indicates a power supply terminal, 'G' indicates a ground terminal, and 'S' indicates a signal terminal. Further, to simplify the drawing, only some of the wiring lines are illustrated, and the other wiring lines are omitted.

FIG. 6 illustrates the wiring line layout on the obverse surface side of the package substrate 3. In order for the positions of the wiring lines and the electrodes to be readily understandable, lines indicating the external form of the IF chip 1 and the core chip 2, and the electrodes formed on the obverse surface of the IF chip 1, are also illustrated in FIG. 6. Further, to simplify the drawing, only some of the wiring lines are illustrated, and the other wiring lines are omitted.

The package substrate 3 has contact plugs 18 provided corresponding to each external electrode 4. The contact plugs 18 electrically connect the wiring lines 22 on the reverse surface side of the package substrate 3 to the wiring lines 23 on the obverse surface side of the package substrate 3. For example, an external electrode 4 which receives a certain signal is electrically connected to an electrode 9 by way of a wiring line 22 formed on the reverse surface of the package substrate 3, a contact plug 18, and a wiring line 23 formed on the obverse surface of the package substrate 3.

The plurality of second electrodes 9 aligned on the obverse surface of the package substrate 3 are respectively connected to the electrodes 5 aligned on the reverse surface of the IF chip 1. Signals (or voltages) input from the electrodes 5 formed on the reverse surface of the IF chip 1 are output to the electrodes 6 formed on the obverse surface of the IF chip 1, by way of internal control circuits in the IF chip 1. Internal signals output from the electrodes 6 on the IF chip 1 are input into electrodes provided on the reverse surface of the core chip 2 provided directly above the IF chip 1. Said internal signals are transmitted to other core chips 2 by way of the through-electrodes 16 and the bump electrodes 11.

Taking into account the fact that multiple IF chips 1 and core chips 2 are manufactured from one wafer, it is preferable that the IF chip 1 and the core chip 2 are as small as possible. However, in the semiconductor device in this mode of embodiment, the length of the IF chip 1 in the Y-direction, in other words in the pad row direction, is greater than the length of the core chip 2 in the Y-direction, and is at most equal to the length of the package substrate 3 in the Y-direction.

In this mode of embodiment, the plurality of electrodes 5 formed on the surface of the IF chip 1 that faces the package substrate 3 are arranged aligned in the Y-direction. Similarly, the plurality of electrodes 9 formed on the surface of the package substrate 3 that faces the IF chip 1 are also arranged aligned in the Y-direction. In FIG. 5, the plurality of electrodes 5 and 9 are each arranged in two rows, but the number of rows in which the electrodes 5 and 9 are arranged is not limited to being two rows.

At least one of the plurality of external electrodes 4 on the package substrate 3 is disposed to the outside of the end portion of the core chip 2 in the Y-direction. Further, at least one of the plurality of electrodes 9 formed on the obverse surface of the package substrate 3 is disposed to the outside of the end portion of the core chip 2 in the Y-direction. The wiring lines connecting the electrodes 4 and 9 formed on the two surfaces of the package substrate 3, in particular the wiring lines 23 illustrated in FIG. 6, can therefore be formed extending substantially in the X-direction. In other words, this makes it unnecessary for the wiring lines to be packed densely from the outer peripheral portion of the package substrate toward the center thereof, as illustrated in FIG. 2. As a result, the wiring lines 23 on the package substrate 3 can be routed easily. Further, the lengths of the wiring lines 23 in the outer peripheral portion of the package substrate 3 are reduced, yielding the benefit that the wiring line capacitance is reduced.

The IF chip 1 preferably extends to approximately the same position as the external electrode 4 positioned outermost in the Y-direction on the package substrate 3. By this means, the external terminals 4 on the package substrate 3 and the electrodes 9 corresponding to said external terminals 4 can be disposed in substantially the same position in the Y-direction. As a result, the wiring lines 23 connecting the external terminals 4 to the electrodes 9 corresponding to said external terminals 4 are shorter, and said wiring lines 23 can be routed more easily.

It should be noted that from the viewpoint of chip miniaturization, the length of the IF chip 1 in the X-direction is preferably less than the length in the X-direction of the core chip 2 and the package substrate 3. The length of the package substrate 3 in the Y-direction should be 15 mm, and its length in the X-direction should be 11 mm. Further, the length of the IF chip 1 in the Y-direction should be 13.25 mm, and its length in the X-direction should be 2.18 mm. Further, the length of the core chip 2 in the Y-direction should be 8.5 mm, and its length in the X-direction should be 7 mm. The numerical values of these lengths are examples, and the lengths in the semiconductor device of the present invention are not limited to the abovementioned numerical values.

In the example illustrated in FIG. 5 and FIG. 6, the IF chip 1 is disposed in the central portion of the package substrate 3 in the X-direction. The electrodes 9 provided on the obverse surface of the package substrate 3 are arranged in two rows in the Y-direction. The external terminals 4 on the package substrate 3 are preferably provided on both sides of the IF chip 1. The external terminals 4 provided on one side of the IF chip 1 are preferably electrically connected to one of the rows of electrodes 9. The external terminals 4 provided on the other side of the IF chip 1 are preferably electrically connected to the other row of electrodes 9. By adopting such a configuration, a greater number of external terminals 4 can be connected to the electrodes 9 using a simple wiring line layout. However, the number of rows of electrodes 9 on the obverse surface of the package substrate 3, and the position in which the IF chip 1 is disposed, may be varied freely.

Figure 7:
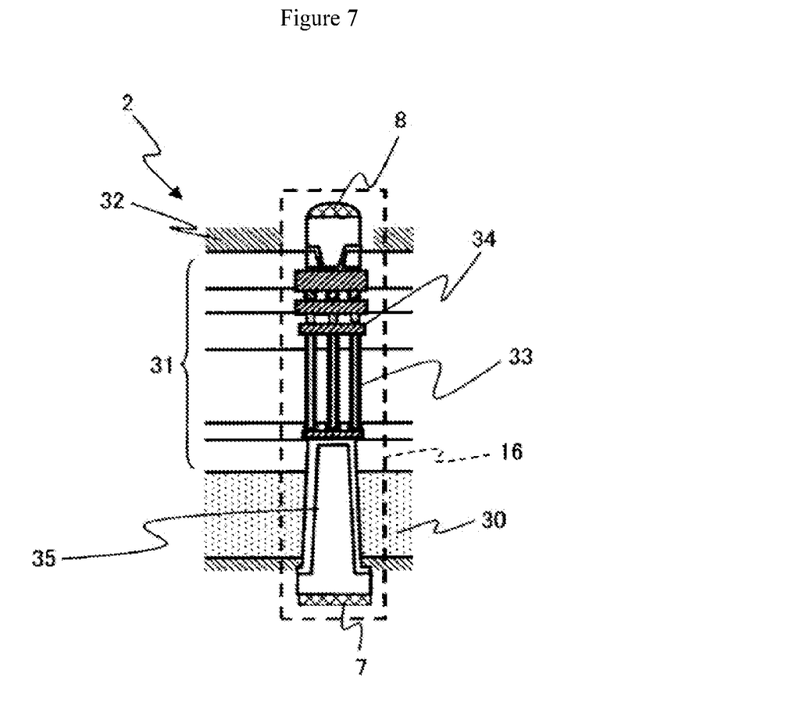
FIG. 7 is a cross-sectional view of a core chip, along a part which passes through a through wiring-line.

FIG. 7 is a cross-sectional view of the core chip 2, along a part which passes through a through electrode 16. The core chip 2 comprises, for example, a semiconductor substrate 30 such as a silicon substrate, and a multilayer wiring-line structure 33, 34 provided on the semiconductor substrate 30. A plurality of insulating layers 31 are formed on one surface of the semiconductor substrate 30. The multilayer wiring-line structure includes contact plugs 33 and wiring-line pads 34 formed in the insulating layers 31. The multilayer wiring-line structure also includes circuit patterns corresponding to the function and application of the semiconductor chip. In the case of a memory chip, the multilayer wiring-line structure includes memory circuits.

Through-electrodes 35 which penetrate through the semiconductor substrate 30 are formed in the core chip 2. Pads (electrical conductors) 7 are formed on the obverse surfaces of the through-electrodes 35. Pads 8 are formed on the obverse surface of the insulating film 31. Passivation films 32 are formed at the periphery of the pads (electrical conductors) 8 formed on the obverse surface of the core chip 2.

The pads 7 formed on the reverse surface of the core chip 2 and the pads 8 formed on the obverse surface of the core chip 2 are electrically connected by way of the multilayer wiring-line structure 33, 34. The pads 7 formed on the reverse surface of a certain core chip 2 are joined to the pads 8 formed on the obverse surface of another core chip 2, and the two pads 7 and 8 form the bump electrodes 11 illustrated in FIG. 3.

Figure 8:
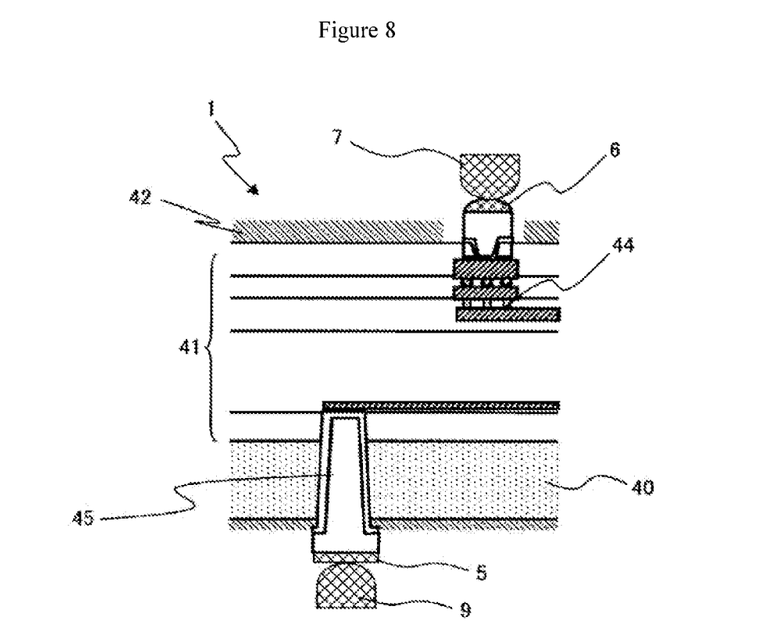
FIG. 8 is a cross-sectional view of an IF chip in one exemplary embodiment.

FIG. 8 is a cross-sectional view of the IF chip 1, along a part which passes through a through wiring-line. The IF chip 1 comprises, for example, a semiconductor substrate 40 such as a silicon substrate, and a multilayer wiring-line structure 44 provided on the semiconductor substrate 40. A plurality of insulating layers 41 are formed on one surface of the semiconductor substrate 40. The multilayer wiring-line structure includes, for example, wiring-line pads 44 formed in the insulating layers 41. The multilayer wiring-line structure includes circuit patterns corresponding to the function and application of the semiconductor chip. In the case of an IF chip, the multilayer wiring-line structure includes IF circuits.

Through-electrodes 45 which penetrate through the semiconductor substrate 40 are formed in the IF chip 1. Electrodes 5 are formed on the obverse surfaces of the through-electrodes 45. Electrodes 6 are formed on the obverse surface of the insulating film 41. Passivation films 42 are formed at the periphery of the electrodes 6 formed on the obverse surface of the IF chip 1.

The electrodes 5 formed on the reverse surface of the IF chip 1 and the electrodes 6 formed on the obverse surface of the IF chip 1 are electrically connected by way of the multilayer wiring-line structure 44. Further, the electrodes 5 formed on the reverse surface of the IF chip 1 are joined to the electrodes 9 formed on the obverse surface of the package substrate 3. Further, the electrodes 6 formed on the obverse surface of the IF chip 1 are electrically connected to the electrodes 7 formed on the reverse surface of the core chip 2. These electrodes 6 and 7 form the bump electrodes 10 illustrated in FIG. 3.

Figure 9:
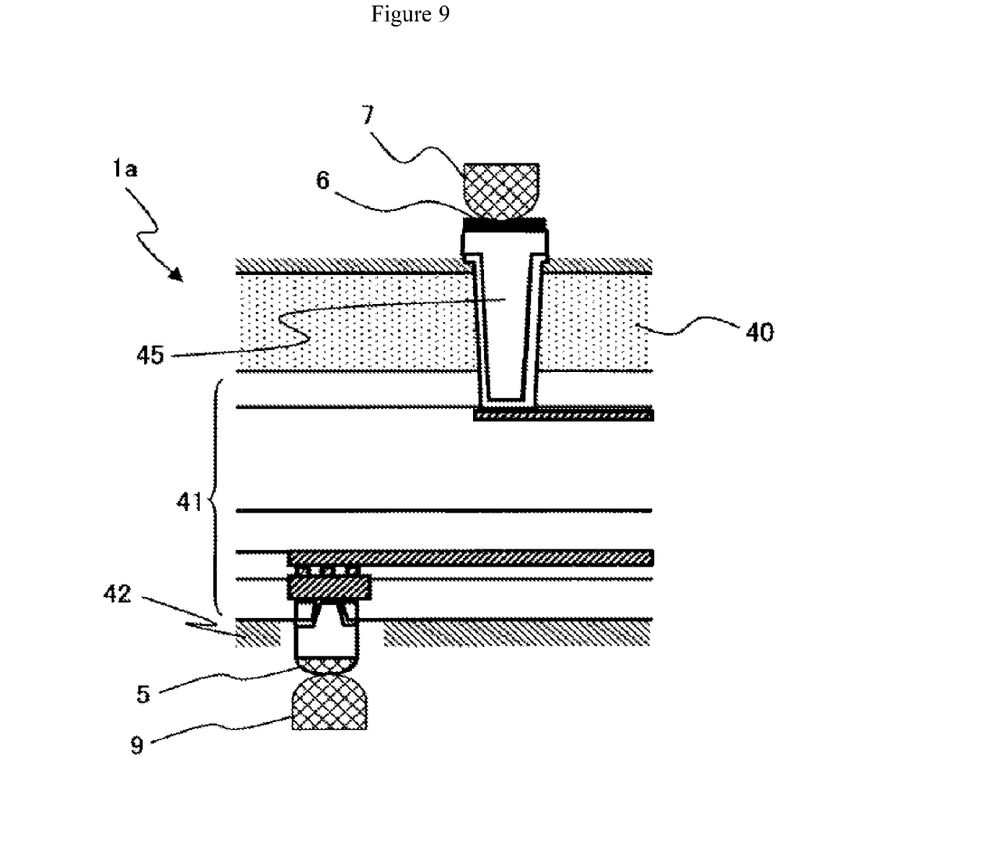
FIG. 9 is a cross-sectional view of an IF chip in another exemplary embodiment.

FIG. 9 is a cross-sectional view of an IF chip 1a along a part which passes through a through wiring-line, illustrating a configuration that is different from that of the IF chip 1 illustrated in FIG. 8. The IF chip 1 comprises the semiconductor substrate 40 and the multilayer wiring-line structure 44 provided on the semiconductor substrate 40.

The IF chip 1 illustrated in FIG. 8 is disposed in such a way that the semiconductor substrate 40 is positioned on the side that is closest to the package substrate 3. In contrast, the IF chip 1a illustrated in FIG. 9 is disposed in such a way that the multilayer wiring-line structure 44 is positioned on the side that is closest to the package substrate 3. Thus the configuration of the IF chips 1 and 1a is not particularly restricted, and any configuration may be used.

Figure 10:
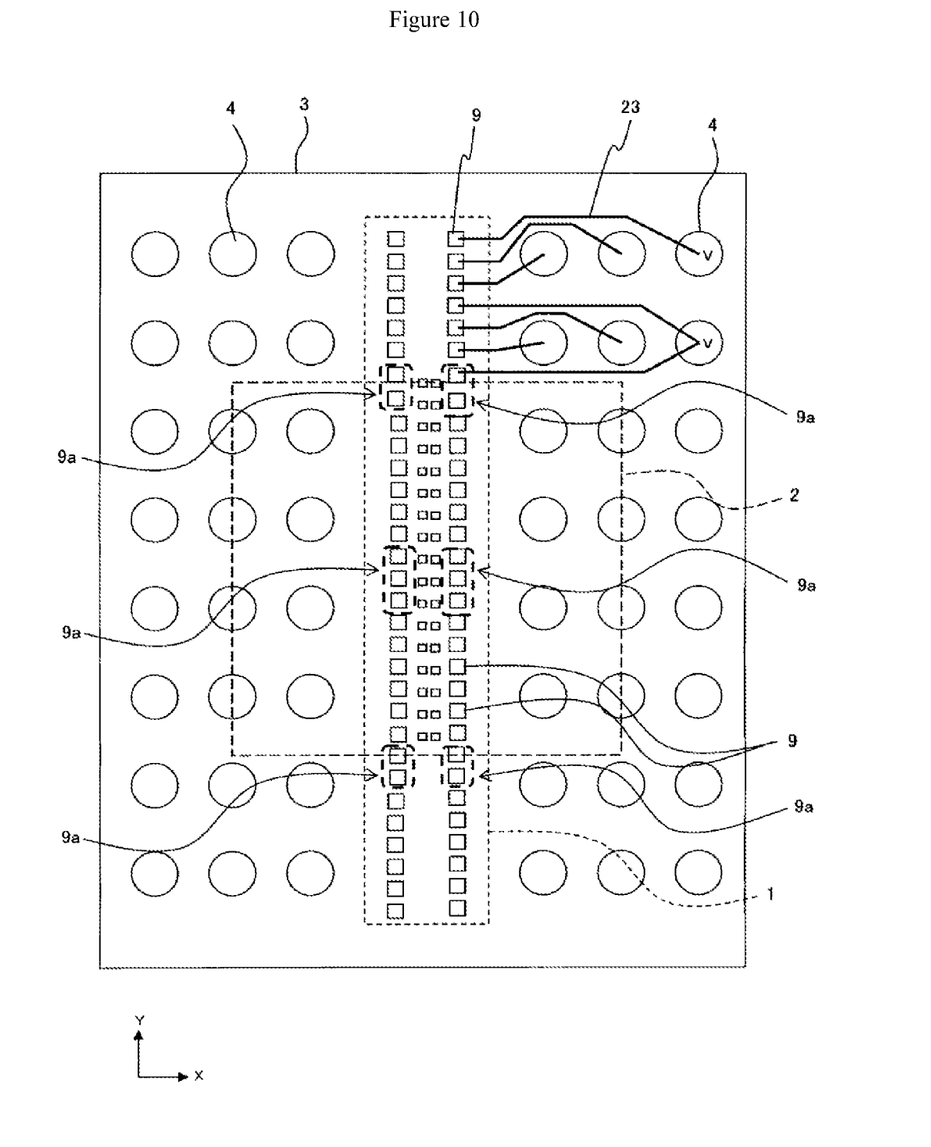
FIG. 10 is a drawing illustrating the wiring line layout on a package substrate in a second mode of embodiment.

FIG. 10 illustrates the wiring line layout on a package substrate 3 in a second mode of embodiment. In order for the positions of the wiring lines and the electrodes to be readily understandable, lines indicating the external form of the IF chip 1 and the core chip 2 are also illustrated in FIG. 10. Further, to simplify the drawing, only some of the wiring lines are illustrated, and the other wiring lines are omitted. In FIG. 10, the wiring lines 23 directly connect the external terminals 4 on the reverse surface of the package substrate 3 to the electrodes 9 on the obverse surface of the package substrate 3. In practice, however, contact plugs 18 may be provided midway along the wiring lines 23, as illustrated in FIG. 5 and FIG. 6. In other words, the wiring lines 23 illustrated in FIG. 10 can also be said to comprise the wiring lines on the obverse surface of the package substrate 3 and the wiring lines on the reverse surface of the package substrate 3, drawn in an integrated manner.

In this mode of embodiment, the length of the IF chip 1 in the Y-direction is greater than the length of the core chip 2 in the Y-direction, and is at most equal to the length of the package substrate 3 in the Y-direction. At least one of the external electrodes 4 on the package substrate 3 is disposed to the outside of the end portion of the core chip 2 in the Y-direction. Further, at least one of the plurality of second electrodes 9 provided on the obverse surface of the package substrate 3 is disposed to the outside of the end portion of the core chip 2 in the Y-direction. The wiring lines 23 connecting the external electrodes 4 and the electrodes 9 formed on the package substrate 3 can therefore be formed extending substantially in the X-direction. As a result, dense packing of the wiring lines on the package substrate 3 can be suppressed.

If the length of the IF chip 1 in the Y-direction is increased, the number of electrodes 5 provided on the IF chip and the number of electrodes 9 on the obverse surface of the package substrate 3 can be increased. This makes it possible to increase the number of power supply wiring lines 23 connected to power supply terminals which serve as external electrodes 4, and the number of ground wiring lines 23 connected to ground terminals which serve as external electrodes 4.

As a specific example, the number of electrodes 9, 9a on the obverse surface of the package substrate can be made larger than the number of external electrodes 4 (see reference code 9a in FIG. 10). This makes it possible for at least one of the power supply terminals 4 and the ground terminals 4 to be electrically connected to at least two of the plurality of electrodes 9. If the number of power supply wiring lines and ground wiring lines increases, the number of return paths for the current flowing to the power source and the ground increases. This has the advantage that the inductance is reduced, and power-supply noise is suppressed.

Further, increasing the number of electrodes 9 on the obverse surface of the package substrate 3 makes it possible to dispose power supply wiring lines and ground wiring lines between signal wiring lines. More specifically, in the package substrate 3, the electrodes 9 on either side of electrodes 9 electrically connected to signal terminals 4 can be electrically connected to either a power supply terminal 4 or a ground terminal 4. This makes it possible to shield noise between pairs of signal wiring lines.

Further, increasing the number of electrodes 9 on the obverse surface of the package substrate 3 is also advantageous in that it is possible to provide terminals for testing, in addition to the power supply, ground and signal terminals.

Figure 11:
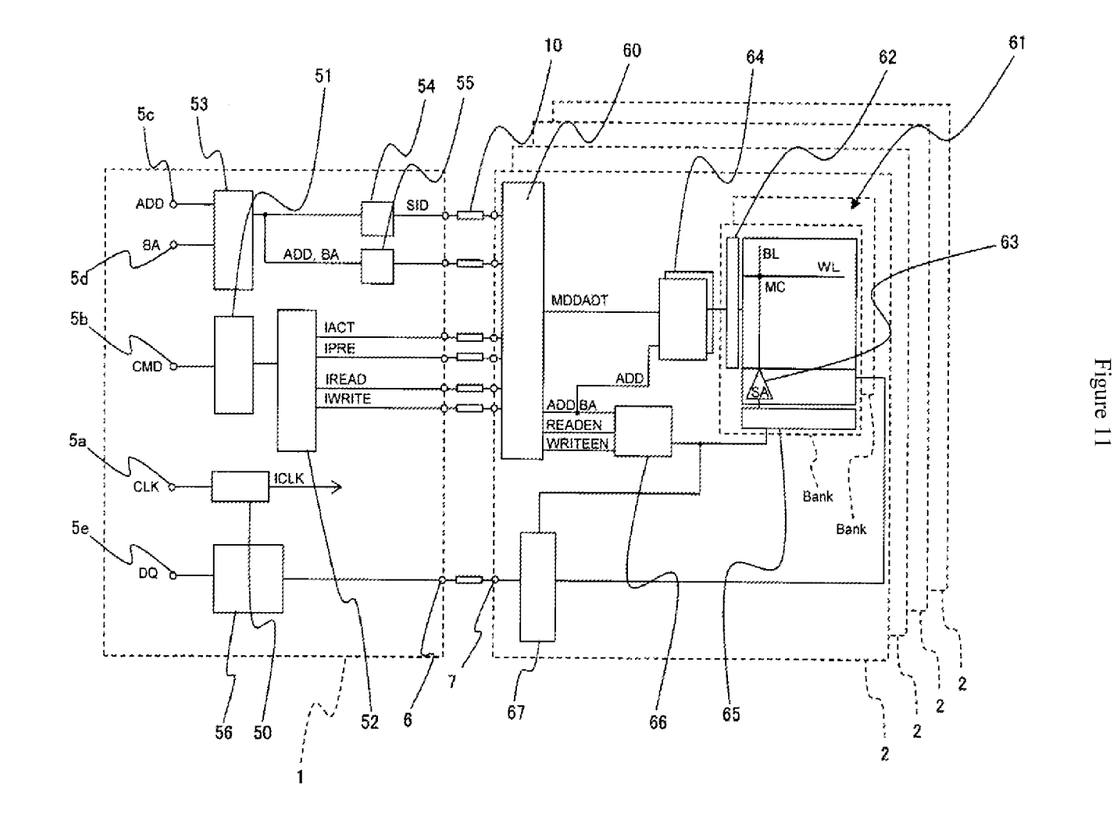
FIG. 11 is a circuit block diagram of a semiconductor device.

FIG. 11 is a circuit block diagram of the semiconductor device in this mode of embodiment. The IF chip 1 is a control chip which controls the plurality of core chips 2. The electrodes 5 on the IF chips 1 and 1a receive input signals by way of the electrodes 9 provided on the obverse surface of the package substrate 3. The input signals are transmitted by wiring lines, which are electrically connected to the electrodes 5, to control circuit portions in the IF chips 1 and 1a. The control circuit portions convert said signals into internal signals which are then output to the electrodes 6 by way of wiring lines. The input signals output from the electrodes 6 are input into each core chip 2 by way of the through-electrodes 16 provided in the core chips 2.

The electrodes 5 provided on the IF chip 1 include a clock terminal 5a, a command terminal 5b, address terminals 5c and 5d, and a data input and output terminal 5e. In addition, calibration terminals, power supply terminals and the like should also be provided. The terminals 5a to 5e are each connected to electrodes 9 on the package substrate 3.

The clock terminal 5a is a terminal to which an external clock signal CLK is supplied. The external clock signal CLK is supplied to an internal clock generating circuit 50. The internal clock generating circuit 50 is a circuit which generates an internal clock signal ICLK. The generated internal clock signal ICLK is supplied to various circuit blocks in the IF chip 1.

The command terminal 5b is a terminal to which command signals are supplied. The command signals are supplied by way of a command input circuit 51 to a command decoder 52. The command decoder 52 decodes the command signals output from the command input circuit 51, thereby generating various internal commands, and it also delays the generated internal commands on the basis of latencies that are set in advance. The internal commands output from the command decoder 52 are supplied by way of the bump electrodes 10 to the core chips 2. The internal commands output from the command decoder 52 include, for example, an active command TACT, a precharge command IPRE, a read command IREAD and a write command IWRITE.

The address terminals 5c and 5d are terminals to which an address signal ADD and a bank address signal BA are supplied, and the supplied address signal ADD and bank address signal BA are supplied by way of the address input circuit 53 to latch circuits 54 and 55.

The address input circuit 53 can extract or generate a chip address SID on the basis of the supplied address signal ADD and bank address signal BA. The chip address SID is synchronized with the internal clock signal ICLK and is latched by the latch circuit 54. The chip address SID latched by the latch circuit 54 is supplied to the core chip 2 by way of the bump electrodes 10.

Further, the latch circuit 55 synchronizes other portions of the address signal ADD and bank address signal BA to the internal clock signal ICLK, latches said portions, and supplies these signals to the core chip 2 by way of the bump electrodes 10.

The data input and output terminal 5e is a terminal used for input and output of write data DQ, and is connected to a data input and output circuit 56. The data input and output circuit 56 receives the write data DQ supplied from the data input and output terminal 5e, and supplies the write data to the core chip 2 by way of the bump electrodes 10.

The circuit configuration in the core chip 2 will now be described. A chip address comparison circuit 60 in each core chip 2 outputs internal signals in accordance with internal command signals output by the command decoder if the chip selection signal SID matches chip information held by the chip address comparison circuit 60 itself. In other words, the chip address comparison circuit 60 compares the chip address SID supplied by the IF chip 1 with a unique chip address assigned to the core chip 2, and activates the command if the two chip addresses match. An MDDADT signal is a signal which is activated when a row-system internal command signal has been activated.

A memory cell array 61 contained in the core chip 2 is divided into a plurality of banks. Banks are units that are capable of accepting commands individually. In other words, each bank can operate in a mutually non-exclusive independent manner. In the memory cell array 61, a plurality of word lines WL and a plurality of bit lines BL intersect. Memory cells MC are disposed at the points of intersection of the word lines WL and the bit lines BL. It should be noted that in FIG. 11, for convenience, only one word line WL, one bit line BL and one memory cell MC are illustrated. Selection of a word line WL is performed by means of a row decoder 62. Further, the bit lines BL are connected to sense amplifiers 63. Selection of a sense amplifier 63 is performed by means of a column decoder 65.

A row address is supplied to the row decoder 62 by way of a row-system control circuit 64. The address signal MDDADT and the address ADD are supplied to the row-system control circuit 64 by way of the chip address comparison circuit 60.

If an active command has been activated, the row-system control circuit 64 supplies the address signal ADD to the row decoder of the bank selected by means of the bank address. The specified word line of the specified bank is thus activated. In other words, row access is performed.

If a refresh command has been activated, the row-system control circuit 64 supplies the count value of a refresh counter, which is not shown in the drawing, to the row decoder of every bank. The specified word line of every bank is thus activated and a refresh operation is performed.

A column address is supplied to the column decoder 65 by way of a column-system control circuit 66. The address signal ADD, the bank address BA, a read command READEN and a write command WRITEEN are supplied to the column-system control circuit 66 by way of the chip address comparison circuit 60.

If the read command READEN or the write command WRITEEN have been activated, the column-system control circuit 66 supplies the address signal ADD to the column decoder 65 of the bank selected by means of the bank address BA. The specified sense amplifier 63 of the specified bank is thus connected to a data amplifier circuit 67.

If the read command READEN has been activated, read data that have been read from the memory cell array 61 by way of the sense amplifier 63 are forwarded to the IF chip 1 by way of the data amplifier circuit 67 and the bump electrodes 10. Further, if the write command WRITEEN has been activated, write data that have been forwarded from the IF chip 1 by way of the bump electrodes 10 are written to the memory cell array 61 by way of the data amplifier circuit 67 and the sense amplifier 63.

The invention devised by the inventors has been described hereinabove with reference to exemplary embodiments, but the present invention is not restricted to the abovementioned exemplary embodiments, and it goes without saying that various modifications are possible without deviating from the gist of the invention.

For example, in the abovementioned exemplary embodiment, a chip stack having four core chips 2 and one IF chip 1 is mounted on a package substrate 3. However, the type and number of semiconductor chips forming the chip stack is arbitrary, and may be selected as appropriate in accordance with the purpose and application, for example.

This application is based upon and claims the benefit of priority from Japanese Patent Application No. 2012-227844, filed on Oct. 15, 2012, the entire disclosure of which is incorporated herein by reference.

EXPLANATION OF THE REFERENCE NUMBERS

1 IF chip
2 Core chip
3 Package substrate
4 External terminal
5 Electrode on reverse surface of IF chip
6 Electrode on obverse surface of IF chip
9 Electrode on obverse surface of package substrate
10 Bump electrode
11 Through wiring-line
12 Non-conductive paste
13 Underfill material
14 Sealing resin
18 Contact plug
22 Wiring line on reverse surface of package substrate
23 Wiring line on obverse surface of package substrate

What is claimed is:
1. A semiconductor device comprises:
  a package substrate comprising a plurality of first electrodes arranged on a first reverse surface, a plurality of second electrodes arranged along a first direction on a first obverse surface on the opposite side to the first reverse surface, and wiring lines which electrically connect the first electrodes and the second electrodes;
  an interface chip which is provided on the first obverse surface of the package substrate and which comprises a plurality of third electrodes which are arranged on a second reverse surface which faces the package substrate, and which are joined to the plurality of second electrodes; and
  a core chip which is provided on a second obverse surface on the opposite side to the second reverse surface of the interface chip, and which is electrically connected to the interface chip;
  wherein the length of the interface chip in the first direction is greater than the length of the core chip in the first direction, and is at most equal to the length of the package substrate in the first direction;

at least one of the plurality of first electrodes is disposed to the outside of the end portion of the core chip in the first direction; and at least one of the plurality of second electrodes is disposed to the outside of the end portion of the core chip in the first direction.

2. The semiconductor device of claim 1, wherein the length of the interface chip in a second direction orthogonal to the first direction is less than the lengths of the core chip and the package substrate in the second direction.

3. The semiconductor device of claim 1, wherein a plurality of fourth electrodes arranged and aligned in the first direction are provided on the second obverse surface of the interface chip, and a plurality of fifth electrodes which are arranged and aligned in the first direction and which are joined respectively to the plurality of fourth electrodes are provided on a surface of the core chip which faces the interface chip.

4. The semiconductor device of claim 1, wherein the plurality of first electrodes includes a power supply terminal, a ground terminal and a signal terminal, the number of second electrodes is greater than the number of first electrodes, and at least one of the power supply terminals and ground terminals is electrically connected by way of the wiring lines to at least two of the second electrodes.

5. The semiconductor device of claim 1, wherein the plurality of first electrodes includes a power supply terminal, a ground terminal and a signal terminal, and the second electrodes on either side of the second electrodes that are electrically connected to each of the signal terminals are electrically connected to either the power supply terminal or the ground terminal.

6. The semiconductor device of claim 1, wherein the second electrodes include a power supply electrode, a ground electrode, a signal electrode and an electrode for testing.

* * * * *